US012740466B2

(12) United States Patent
Shimooka

(10) Patent No.: US 12,740,466 B2
(45) Date of Patent: Sep. 15, 2026

(54) SEMICONDUCTOR DEVICE WITH A METAL ARRAY PORTION WITH REMOVED CORNERS TO REDUCE METAL PORTION HEIGHT VARIATIONS

(71) Applicants: Kabushiki Kaisha Toshiba, Tokyo (JP); Toshiba Electronic Devices & Storage Corporation, Tokyo (JP)

(72) Inventor: Yoshiaki Shimooka, Sagamihara Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 324 days.

(21) Appl. No.: 18/455,573

(22) Filed: Aug. 24, 2023

(65) Prior Publication Data

US 2024/0321797 A1 Sep. 26, 2024

(30) Foreign Application Priority Data

Mar. 22, 2023 (JP) ................................ 2023-045987

(51) Int. Cl.
*H10B 43/27* (2023.01)
*G11C 11/408* (2006.01)
(Continued)

(52) U.S. Cl.
CPC ......... *H10W 72/20* (2026.01); *H10W 72/012* (2026.01); *H10W 72/01255* (2026.01); *H10W 72/248* (2026.01); *H10W 72/252* (2026.01)

(58) Field of Classification Search
CPC .................... H01L 24/16; H01L 24/17; H01L 23/49816; H01L 23/3128; H01L 23/50; H01L 2924/15311; H01L 2924/15321; H01L 2924/15331; H01L 2924/1421; H01L 23/49838; H01L 2224/14179;
(Continued)

(56) References Cited

U.S. PATENT DOCUMENTS 5,729,894 A * 3/1998 Rostoker ............. G03F 7/70433 29/841
10,121,754 B2 * 11/2018 Oliver ................ H01L 25/0652
(Continued)

FOREIGN PATENT DOCUMENTS

JP 2007-220870 A 8/2007

OTHER PUBLICATIONS

Madhav Datta "Manufacturing processes for fabrication of flip-chip micro-bumps used in microelectronic packaging: An overview", Journal of Micromanufacturing. 2020;3(1): pp. 69-83.

Notice of Reasons for Refusal issued on Feb. 6, 2026, in the counterpart Japanese patent application No. 2023-045987, 10 pages (with Translation).

*Primary Examiner* — Wael M Fahmy
*Assistant Examiner* — Aneesa Riaz Baig
(74) *Attorney, Agent, or Firm* — Kim & Stewart LLP

(57) ABSTRACT

According to one embodiment, a semiconductor device includes a semiconductor substrate and an array portion. The array portion includes a plurality of metal portions arranged on the semiconductor substrate. When a virtual quadrilateral circumscribing minimally a contour shape of the array portion on the semiconductor substrate is set, the contour shape of the array portion does not overlap each of four vertices of the virtual quadrilateral.

14 Claims, 12 Drawing Sheets

(51) Int. Cl.

| | |
|---|---|
| ***G11C 11/412*** | (2006.01) |
| ***G11C 11/418*** | (2006.01) |
| ***H01L 21/768*** | (2006.01) |
| ***H01L 23/48*** | (2006.01) |
| ***H01L 25/00*** | (2006.01) |
| ***H01L 25/065*** | (2023.01) |
| ***H10B 41/27*** | (2023.01) |
| ***H10B 41/30*** | (2023.01) |
| ***H10B 41/35*** | (2023.01) |
| ***H10B 43/30*** | (2023.01) |
| ***H10B 43/35*** | (2023.01) |
| ***H10W 72/00*** | (2026.01) |
| ***H10W 72/20*** | (2026.01) |
| ***H10W 72/30*** | (2026.01) |
| ***H10W 72/59*** | (2026.01) |
| ***H10W 72/90*** | (2026.01) |
| ***H10W 90/00*** | (2026.01) |

(58) Field of Classification Search

CPC ................. H10W 72/20; H10W 70/65; H10W 72/247; H10W 72/248; H05K 3/3436; H05K 2201/09418

See application file for complete search history.

(56) References Cited

U.S. PATENT DOCUMENTS

| | | | | |
|---|---|---|---|---|
| 2004/0227233 | A1 | 11/2004 | Hussa | |
| 2004/0238973 | A1 | 12/2004 | Wakisaka | |
| 2007/0085224 | A1* | 4/2007 | Kouno | H01L 23/3114 257/E23.021 |
| 2007/0164432 | A1 | 7/2007 | Wakisaka | |
| 2007/0165388 | A1* | 7/2007 | Hussa | H01L 24/10 257/E23.07 |
| 2011/0151627 | A1* | 6/2011 | Graf | H05K 3/3436 257/E21.506 |

* cited by examiner 20
12

22
20
12

24
22
20
12

16a
16a
24
22
20
12

16a
16a
22
20
12

14
10
16
16a
16b
16a
16b
16
20
12

SEMICONDUCTOR DEVICE WITH A METAL ARRAY PORTION WITH REMOVED CORNERS TO REDUCE METAL PORTION HEIGHT VARIATIONS

CROSS-REFERENCE TO RELATED APPLICATIONS

This application is based upon and claims the benefit of priority from Japanese Patent Application No. 2023-045987, filed on Mar. 22, 2023; the entire contents of which are incorporated herein by reference.

FIELD

Embodiments described herein relate to a semiconductor device and a method for manufacturing the same.

BACKGROUND

There is a semiconductor device including a semiconductor substrate and an array portion including multiple metal portions arranged on the semiconductor substrate. In such a semiconductor device, it is desired to prevent variations in heights of the multiple metal portions.

DETAILED DESCRIPTION

Figures 1A, 1B:
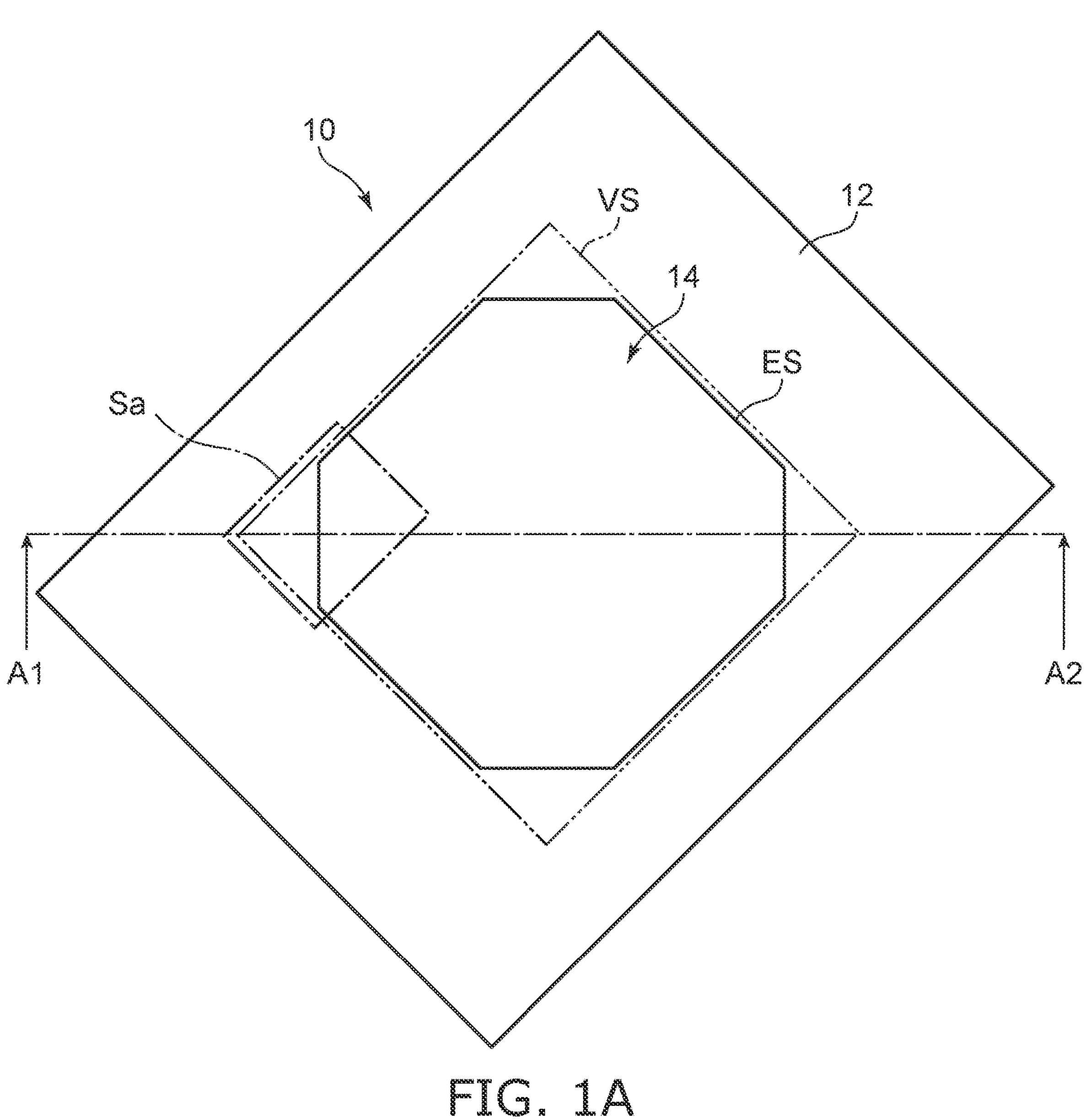
FIG. 1A is a plan view schematically showing a semiconductor device according to a first embodiment.
FIG. 1B is a cross-sectional view schematically showing the semiconductor device according to the first embodiment.

According to one embodiment, a semiconductor device includes a semiconductor substrate and an array portion. The array portion includes a plurality of metal portions arranged on the semiconductor substrate. When a virtual quadrilateral circumscribing minimally a contour shape of the array portion on the semiconductor substrate is set, the contour shape of the array portion does not overlap each of four vertices of the virtual quadrilateral.

According to another embodiment, a method is disclosed for manufacturing a semiconductor device. The semiconductor device includes a semiconductor substrate, and an array portion including a plurality of metal portions arranged on the semiconductor substrate. When a virtual quadrilateral circumscribing minimally a contour shape of the array portion on the semiconductor substrate is set, the contour shape of the array portion does not overlap four vertices of the virtual quadrilateral. The method can include applying a resist on a semiconductor substrate. The method can include forming a pattern having a shape corresponding to the plurality of metal portions in the resist. The method can include forming a plurality of first conductive portions on the semiconductor substrate by forming a metal layer in openings of the patterned resist. The method can include forming the plurality of metal portions by the plurality of first conductive portions by removing the resist.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Also, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIGS. 1A and 1B are a plan view and a cross-sectional view schematically showing a semiconductor device according to a first embodiment.

FIG. 1B schematically shows a cross section taken along a line A1-A2 in FIG. 1A.

Figure 2:
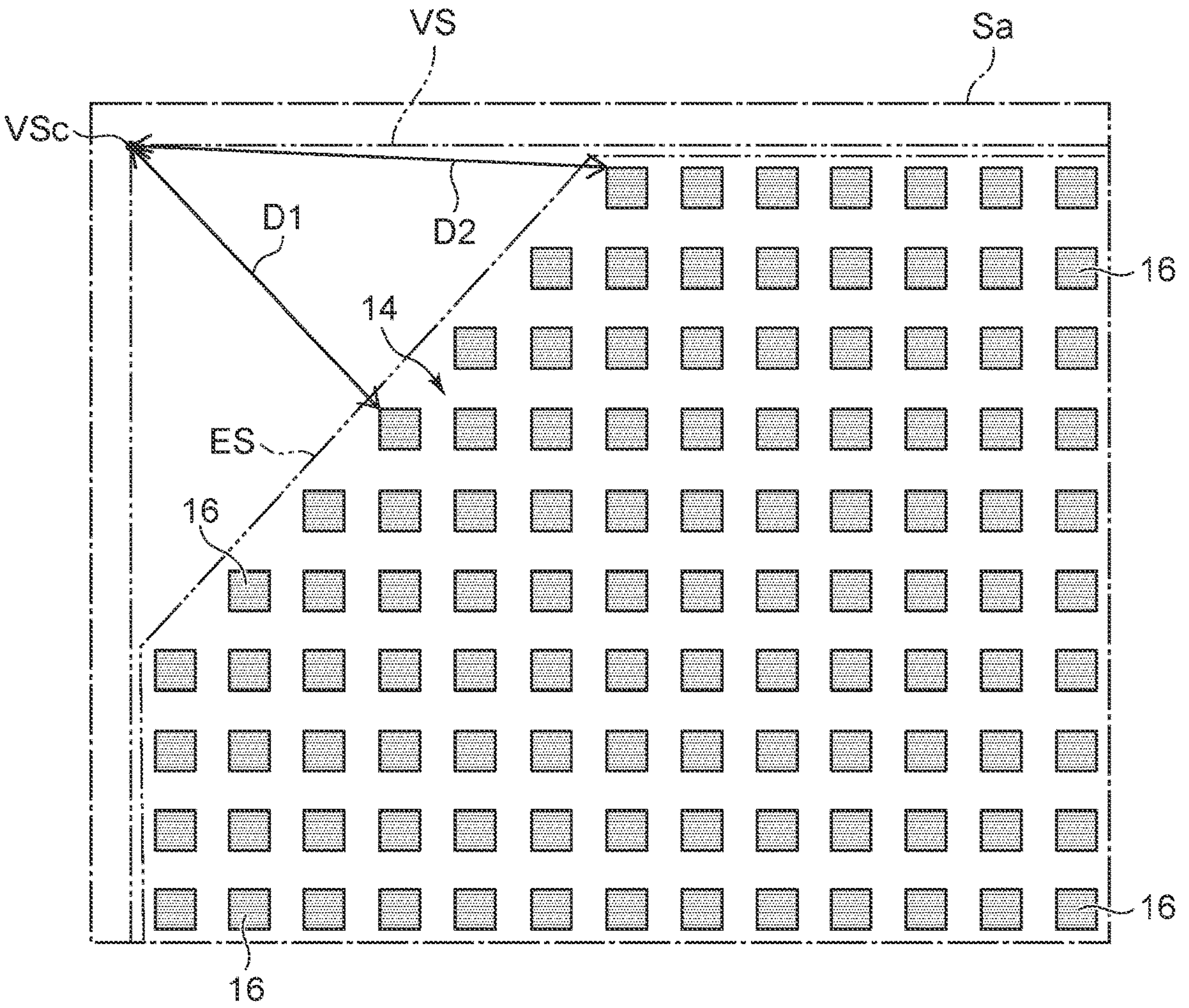
FIG. 2 is an enlarged plan view schematically showing a part of the semiconductor device according to the first embodiment.

FIG. 2 is an enlarged plan view schematically showing a part of the semiconductor device according to the first embodiment.

FIG. 2 is an enlarged view of an enclosed portion Sa in FIG. 1A.

As shown in FIGS. 1A, 1B, and 2, a semiconductor device 10 includes a semiconductor substrate 12 and an array portion 14. The semiconductor substrate 12 contains, for example, silicon. In other words, the semiconductor substrate 12 is a silicon substrate. However, the semiconductor substrate 12 is not limited thereto, and may be a substrate containing another semiconductor material such as silicon carbide or gallium nitride.

The array portion 14 is provided on the semiconductor substrate 12. The array portion 14 includes multiple metal portions 16 arranged on the semiconductor substrate 12. The multiple metal portions 16 are arranged in a predetermined pattern on the semiconductor substrate 12. In other words, the multiple metal portions 16 are multiple metal patterns patterned on the semiconductor substrate 12. In other words, the array portion 14 is a metal pattern array portion.

In FIG. 1A, the multiple metal portions 16 are not shown for convenience. In FIG. 1B, a scale of the multiple metal portions 16 is enlarged and the multiple metal portions 16 are schematically shown for ease of illustration. For example, as shown in FIG. 2, the array portion 14 includes many patterned metal portions 16. In FIG. 1B and FIG. 2, only some of the metal portions 16 are denoted by reference numerals for convenience. In FIGS. 1B and 2, all portions having the same shape as the metal portions 16 denoted by the reference numerals are the metal portions 16.

As shown in FIG. 1B, each of the multiple metal portions 16 includes a first conductive portion 16*a* and a second conductive portion 16*b*. The second conductive portion 16*b* is provided between the semiconductor substrate 12 and the first conductive portion 16*a*. The first conductive portion 16*a* contains, for example, at least one of tin, silver, copper, aluminum, nickel, and gold. The second conductive portion 16*b* contains, for example, at least one of tin, silver, copper, aluminum, nickel, platinum, titanium, palladium, and gold.

The first conductive portion 16*a* is formed by, for example, electroplating. The second conductive portion 16*b* is formed by, for example, sputtering or chemical vapor deposition (CVD). The second conductive portion 16*b* is, for example, a part of a metal layer (seed layer) used as an electrode when forming the first conductive portion 16*a* by electroplating.

However, a material of the second conductive portion 16*b* may be the same as that of the first conductive portion 16*a*. The first conductive portion 16*a* and the second conductive portion 16*b* may contain, for example, gold. In this case, the second conductive portion 16*b* is integrated with the first conductive portion 16*a*, and a boundary between the first conductive portion 16*a* and the second conductive portion 16*b* may not be known. Therefore, each of the multiple metal portions 16 may not necessarily include the second conductive portion 16*b*. The multiple metal portions 16 may be members made of a single metal.

A height HT of each of the multiple metal portions 16 is, for example, 10 nm or more and 40 μm or less. In other words, the height HT of the metal portion 16 is a length from an end portion of the metal portion 16 on a semiconductor substrate 12 side to an end portion of the metal portion 16 on a side opposite to the semiconductor substrate 12. More preferably, the height HT of each of the multiple metal portions 16 is, for example, 5 μm or more and 40 μm or less. A length (thickness) of the first conductive portion 16*a* in a height direction is larger than a length (thickness) of the second conductive portion 16*b* in the height direction.

When the metal portion 16 is formed by sputtering, CVD, or the like, the height HT of the metal portion 16 is, for example, approximately several tens of nm to 1 μm. In addition, when electroplating is used, the height HT of the metal portion 16 can be appropriately set to, for example, several μm to several tens of μm. Therefore, the metal portion 16 (the first conductive portion 16*a*) having high performance and high quality can be formed by electroplating such that the height HT of the metal portion 16 is 5 μm or more and 40 μm or less. In other words, it can be considered that the metal portion 16 is formed by electroplating when the metal portion 16 includes the second conductive portion 16*b* or when the metal portion 16 has the height HT of 5 μm or more and 40 μm or less.

As shown in FIG. 2, for example, the multiple metal portions 16 are arranged in a matrix on the semiconductor substrate 12. More specifically, the multiple metal portions 16 are arranged in a first direction parallel to a surface of the semiconductor substrate 12 and a second direction that is parallel to the surface of the semiconductor substrate 12 and that is orthogonal to the first direction. The first direction is, for example, a left-right direction of a paper surface of FIG. 2. The second direction is, for example, an upper-lower direction of the paper surface of FIG. 2.

A shape of each of the multiple metal portions 16 as viewed from a direction orthogonal to the surface of the semiconductor substrate 12 is, for example, rectangular. In other words, a shape of each of the multiple metal portions 16 as viewed from above is, for example, rectangular. Each of the multiple metal portions 16 has, for example, a quadrangular prism shape.

However, an arrangement of the multiple metal portions 16 and the shape of each of the multiple metal portions 16 are not limited to the above. The multiple metal portions 16 may be arranged as desired. Each of the multiple metal portions 16 may have any shape. The shape of each of the multiple metal portions 16 as viewed from above may be, for example, polygonal, circular, or elliptical other than the above.

The semiconductor device 10 is applied to, for example, an image sensor in which multiple light-receiving elements are arranged on the semiconductor substrate 12, a memory in which multiple circuits are arranged on the semiconductor substrate 12, an LED array in which multiple light-emitting diodes (LEDs) are arranged on the semiconductor substrate 12, a radio frequency-micro electro mechanical system (RF-MEMS) device that transmits and receives multiple signals to and from another device or the like, and a high-performance logic device that transmits and receives multiple signals to and from another device or the like. The multiple metal portions 16 are, for example, metal electrodes used for electrical connection with another substrate or the like. The multiple metal portions 16 may be referred to as bumps (protruding electrodes), for example.

The semiconductor device 10 may be applied to, for example, an electron beam control device such as an electron lens or a deflector that changes a traveling direction of an electron beam. The electron beam control device is used, for example, in an electron microscope that performs surface defect detection using an electron beam, an electron beam lithography device that draws a fine pattern on a mask or a wafer using an electron beam, or an inspection device that detects a defect by scanning a surface of an object with an electron beam. The multiple metal portions 16 may be used as electrodes for changing a traveling direction of the electron beam, for example.

The semiconductor device 10 is not limited to the above, and can be applied to any device requiring multiple metal portions 16 arranged on the semiconductor substrate 12. The arrangement, shape, and number of the multiple metal portions 16 may be appropriately set according to the use of the semiconductor device 10.

The semiconductor substrate 12 further includes, for example, a circuit such as a complementary metal-oxide-semiconductor (CMOS) circuit. The circuit performs, for example, input and output of signals from the multiple metal portions 16 and setting of potentials of the multiple metal portions 16. The circuit provided on the semiconductor substrate 12 may be appropriately set according to the use of the semiconductor device 10. However, the semiconductor substrate 12 may not necessarily have a circuit. The semiconductor substrate 12 may have, for example, only a wiring pattern for obtaining electrical connection with the multiple metal portions 16.

As shown in FIGS. 1A and 2, a contour shape ES of the array portion 14 on the semiconductor substrate 12 is a polygonal shape having interior angles larger than 90°. For example, the contour shape ES is octagonal. More specifically, the contour shape ES is a shape obtained by cutting four corners of a quadrilateral and trimming it.

In other words, the contour shape ES is a shape of a contour of the array portion 14 as viewed from the direction orthogonal to the surface of the semiconductor substrate 12. In other words, the contour shape ES is the shape of the contour of the array portion 14 projected on the surface of the semiconductor substrate 12.

The contour shape ES can be obtained, for example, by linear approximation (polygonal approximation) of line segments connecting outer edges of metal portions 16 located at an outermost periphery among the multiple metal portions 16 as viewed from the direction orthogonal to the surface of the semiconductor substrate 12 or in a layout pattern on the surface of the semiconductor substrate 12. In other words, the contour shape ES is a shape obtained by linearly approximating the line segments connecting the outer edges of the predetermined number of metal portions 16 located at the outermost periphery.

For example, as shown in FIG. 2, the actual contour of the array portion 14 may include a portion that changes stepwise, a portion that changes in a wave shape, or the like. The arrangement of the multiple metal portions 16 may have, for example, a minute deviation due to a manufacturing error or the like. The contour shape ES is not limited to an exact contour of the array portion 14, and may be substantially a contour of the array portion 14. The metal portions 16 located at the outermost periphery may partially include, for example, a portion protruding outward from the contour shape ES. The contour shape ES may be, for example, an optimally shaped polygon circumscribing the array portion 14 (the multiple metal portions 16).

As shown in FIGS. 1A and 2, a virtual quadrilateral VS is set for the contour shape ES of the array portion 14. The virtual quadrilateral VS is a quadrilateral circumscribing minimally the contour shape ES of the array portion 14 on the semiconductor substrate 12. The virtual quadrilateral VS is a quadrilateral having a minimum area and circumscribing the contour shape ES of the array portion 14 on the semiconductor substrate 12. In other words, the virtual quadrilateral VS is a quadrilateral having a minimum area and circumscribing the contour shape ES of the array portion 14 as viewed in the direction orthogonal to the surface of the semiconductor substrate 12. In FIGS. 1A and 2, the virtual quadrilateral VS is shown slightly larger than the array portion 14 for ease of illustration.

In this way, when the virtual quadrilateral VS is set for the contour shape ES of the array portion 14, the contour shape ES of the array portion 14 does not overlap four vertices of the virtual quadrilateral VS.

A length of one side of the virtual quadrilateral VS is, for example, 15 mm or more. In other words, a width (a length in a parallel direction to the surface of the semiconductor substrate 12) of the array portion 14 is, for example, 15 mm or more. Further, the length of one side of the virtual quadrilateral VS is, for example, 30 mm or less. However, a size of the array portion 14 is not limited to the above, and may be any size.

A shortest distance D1 from a vertex VSc of the virtual quadrilateral VS to the array portion 14 (the multiple metal portions 16) is, for example, 1.5% or more of a length of a diagonal line of the virtual quadrilateral VS. In other words, the shortest distance D1 is a distance from the vertex VSc to the closest metal portion 16. The shortest distance D1 from the vertex VSc of the virtual quadrilateral VS to the array portion 14 is, for example, 0.35 mm or more. The shortest distance D1 from the vertex VSc of the virtual quadrilateral VS to the array portion 14 is, for example, 17% or less of the length of the diagonal line of the virtual quadrilateral VS. The shortest distance D1 from the vertex VSc of the virtual quadrilateral VS to the array portion 14 is, for example, 4 mm or less.

A longest distance D2 from the vertex VSc of the virtual quadrilateral VS to the array portion 14 is, for example, 17% or less of the length of the diagonal line of the virtual quadrilateral VS. In other words, the longest distance D2 is a distance from the vertex VSc to the metal portion 16 located at a farthest position, which can be connected to the vertex VSc by a straight line without crossing other metal portions 16. The longest distance D2 from the vertex VSc of the virtual quadrilateral VS to the array portion 14 is, for example, 4 mm or less. However, the longest distance D2 from the vertex VSc of the virtual quadrilateral VS to the array portion 14 may be, for example, any distance equal to or larger than the shortest distance D1 from the vertex VSc of the virtual quadrilateral VS to the array portion 14.

FIGS. 3A to 3F are cross-sectional views schematically showing an example of a manufacturing process of the semiconductor device according to the first embodiment.

Figures 3A, 3B, 3C, 3D, 3E, 3F:
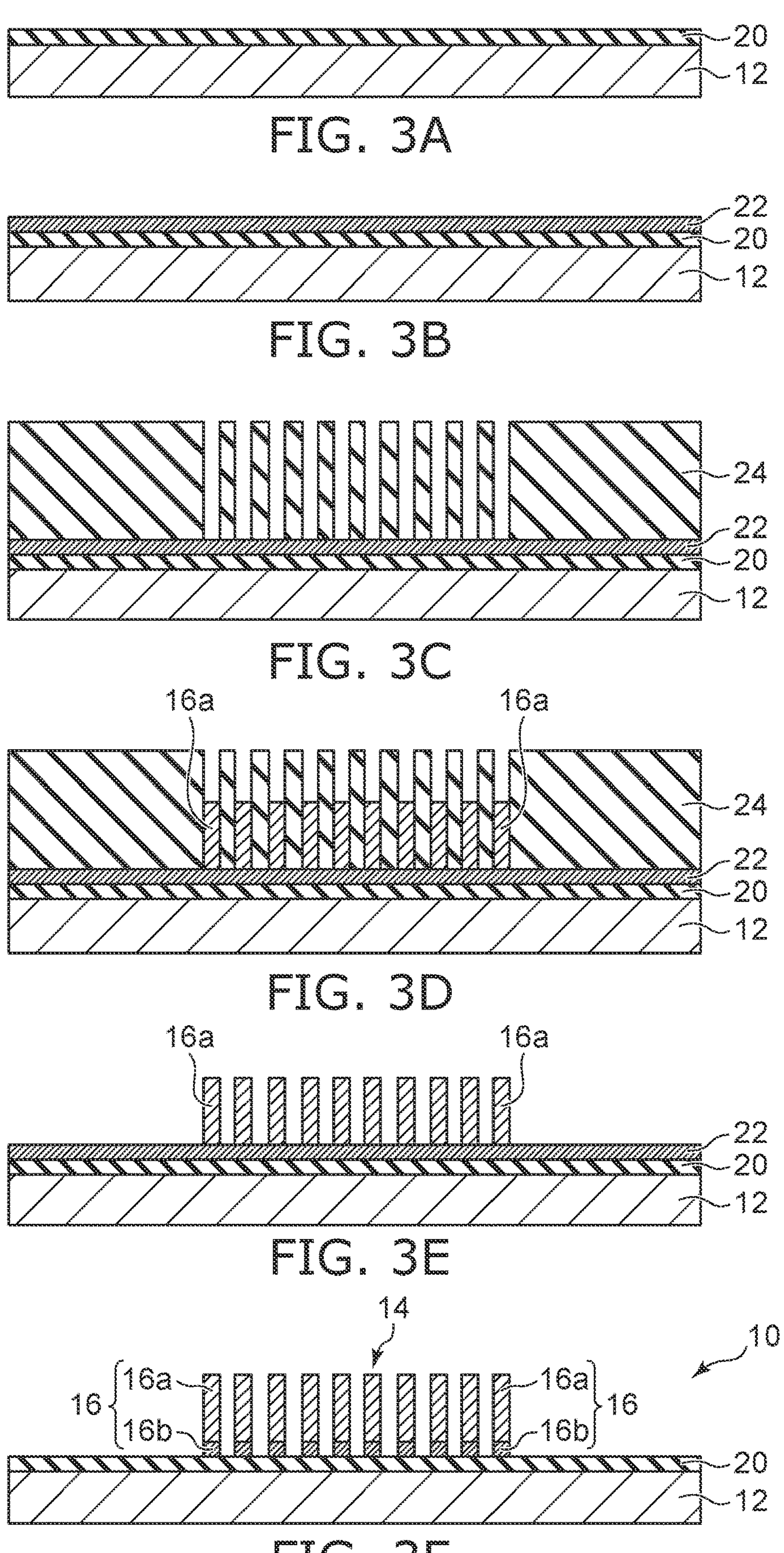
FIGS. 3A to 3F are cross-sectional views schematically showing an example of a manufacturing process of the semiconductor device according to the first embodiment.

As shown in FIG. 3A, in manufacturing the semiconductor device 10, first, an insulating layer 20 is formed on the semiconductor substrate 12. For example, when the semiconductor substrate 12 is a silicon substrate, the insulating layer 20 contains silicon oxide, silicon nitride, or the like. The insulating layer 20 is formed by, for example, CVD. A thickness of the insulating layer 20 is, for example, appropriately several tens of nm to several μm. At this time, the semiconductor substrate 12 may be provided with a CMOS circuit or the like (not shown).

As shown in FIG. 3B, a metal layer 22 is formed on the insulating layer 20. The metal layer 22 is a metal layer that is used as an electrode when a film is formed thereon by electroplating and serves as the second conductive portion 16*b* later. The metal layer 22 is formed by, for example, sputtering or CVD. Similarly to the second conductive portion 16*b*, the metal layer 22 contains, for example, at least one of tin, silver, copper, aluminum, nickel, platinum, titanium, palladium, and gold.

As shown in FIG. 3C, a resist 24 is applied on the metal layer 22. At this time, a thickness of the resist 24 is made thicker than a desired height of the metal portion 16. After the resist 24 is applied, the resist 24 is patterned by lithography to form a pattern having a shape corresponding to the multiple metal portions 16 in the resist 24.

As shown in FIG. 3D, multiple first conductive portions 16*a* are formed on the metal layer 22 by forming a metal layer in openings of the patterned resist 24. The multiple first conductive portions 16*a* are formed by, for example, electroplating using the metal layer 22 as an electrode. A height of each of the multiple first conductive portions 16*a* (a thickness of a metal layer formed by electroplating) is, for example, approximately several tens of nm to several tens of μm.

As shown in FIG. 3E, after the multiple first conductive portions 16*a* are formed, the resist 24 is removed by ashing, wetting using a chemical solution, or the like.

As shown in FIG. 3F, multiple second conductive portions 16*b* are formed between the multiple first conductive portions 16*a* and the semiconductor substrate 12 by patterning the metal layer 22 using the multiple first conductive portions 16*a* as a mask. For example, wet etching using a chemical solution or reactive ion etching (RIE) is used to pattern the metal layer 22.

Accordingly, the array portion 14 including the multiple metal portions 16 arranged on the semiconductor substrate 12 is provided on the semiconductor substrate 12, and the semiconductor device 10 is manufactured.

Although not shown in FIG. 1B, the semiconductor device 10 may further include the insulating layer 20 provided on the semiconductor substrate 12 as shown in FIG. 3F. In this case, the multiple metal portions 16 (the array portion 14) are provided, for example, on the insulating layer 20. For example, the insulating layer 20 may be patterned similarly to the metal layer 22. The semiconductor device 10 may include, for example, multiple insulating portions provided between the multiple metal portions 16 (the second conductive portions 16*b*) and the semiconductor substrate 12. The insulating layer 20 is provided as necessary and may be omitted.

In this way, a method for manufacturing the semiconductor device 10 includes a process of applying the resist 24 on the semiconductor substrate 12, a process of forming a pattern having a shape corresponding to the multiple metal portions 16 in the resist 24, a process of forming the multiple first conductive portions 16*a* on the semiconductor substrate 12 by forming a metal layer in openings of the patterned resist 24, and a process of forming the multiple metal portions 16 by the multiple first conductive portions 16*a* by removing the resist 24.

The process of applying the resist 24 on the semiconductor substrate 12 includes a process of forming the metal layer 22 (an electrode metal layer) on the semiconductor substrate 12 and a process of providing the resist 24 on the metal layer 22.

The process of forming the multiple first conductive portions 16*a* includes a process of forming the multiple first conductive portions 16*a* by electroplating using the metal layer 22 as an electrode.

The process of forming the multiple metal portions 16 includes a process of forming the multiple metal portions 16 by the multiple first conductive portions 16*a* and the multiple second conductive portions 16*b* by patterning the metal layer 22 using the multiple first conductive portions 16*a* as a mask after removing the resist 24 and forming the multiple second conductive portions 16*b* between the multiple first conductive portions 16*a* and the semiconductor substrate 12.

A method for forming the multiple first conductive portions 16*a* is not limited to electroplating. The multiple first conductive portions 16*a* may be formed by another forming method such as sputtering. In this case, the process of forming the metal layer 22 for the electrode can be omitted. In this case, the process of forming the multiple second conductive portions 16*b* can also be omitted. For example, the multiple metal portions 16 may be formed only by the multiple first conductive portions 16*a* provided in the openings of the resist 24.

Figure 4:
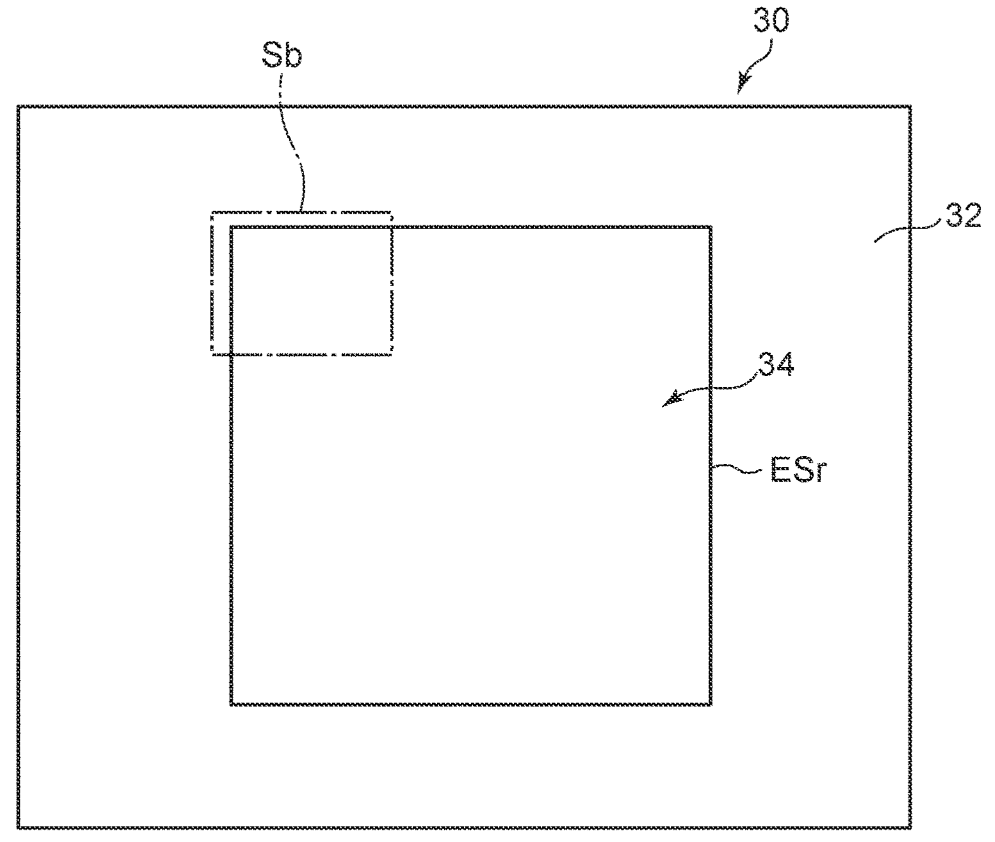
FIG. 4 is a plan view schematically showing a semiconductor device for reference.

FIG. 4 is a plan view schematically showing a semiconductor device for reference.

Figure 5:
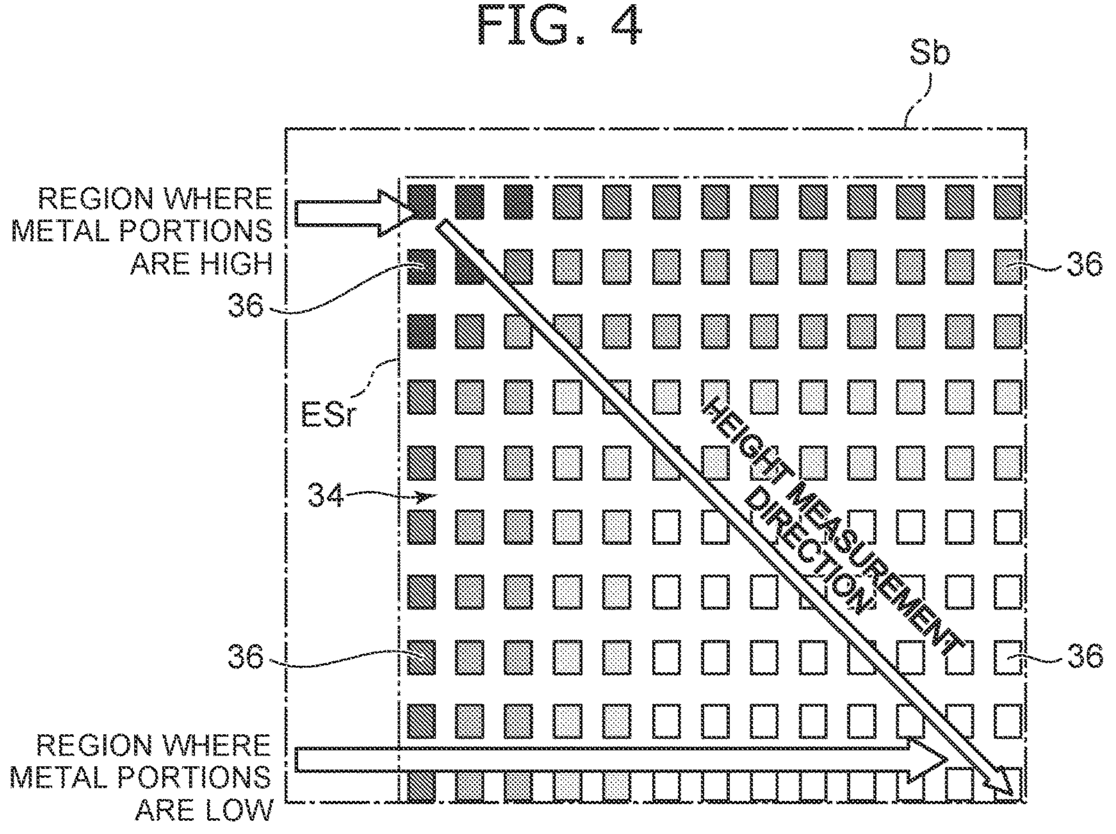
FIG. 5 is an enlarged plan view schematically showing a part of the semiconductor device for reference.

FIG. 5 is an enlarged plan view schematically showing a part of the semiconductor device for reference.

FIG. 5 is the enlarged view of an enclosed portion Sb in FIG. 4.

As shown in FIGS. 4 and 5, a semiconductor device 30 for reference includes a semiconductor substrate 32 and an array portion 34 including multiple metal portions 36 arranged on the semiconductor substrate 32. In the semiconductor device 30 for reference, a contour shape ESr of the array portion 34 on the semiconductor substrate 32 is quadrilateral. In the semiconductor device 30, interior angles of the contour shape ESr are 90°. In this case, when the virtual quadrilateral VS is set for the contour shape ESr of the array portion 34, the contour shape ESr of the array portion 34 overlaps four vertices of the virtual quadrilateral VS. Since a configuration of the semiconductor device 30 is similar to that of the semiconductor device 10 except for the contour shape ESr of the array portion 34, detailed description thereof will be omitted.

Figure 6:
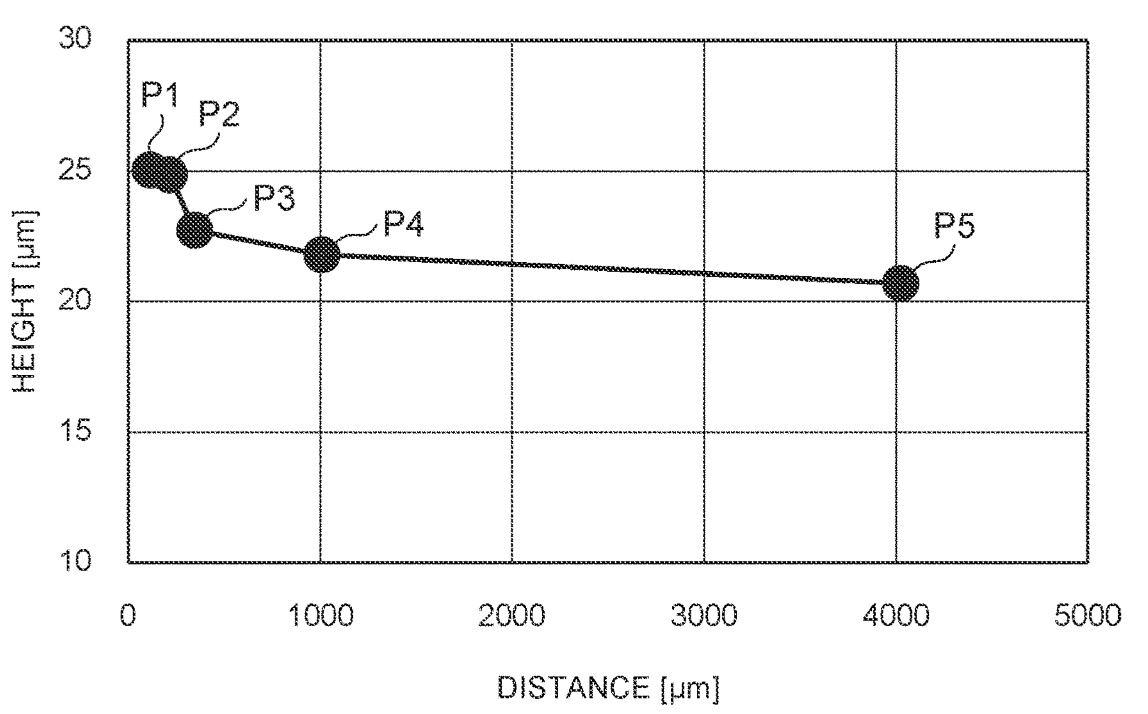
FIG. 6 is a graph schematically showing an example of characteristics of the semiconductor device for reference.

FIG. 6 is a graph schematically showing an example of characteristics of the semiconductor device for reference.

A horizontal axis in FIG. 6 represents a distance from a corner portion of the quadrilateral contour shape ESr. A vertical axis in FIG. 6 represents a height of the metal portion 36. FIG. 6 schematically shows an example of a measurement result of measuring a height of each of the metal portions 36 located on a diagonal line from the metal portion 36 located at a corner portion of the quadrilateral contour shape ESr toward the metal portion 36 located diagonally as shown in FIG. 5.

In FIG. 6, a measurement point P1 is a measurement result for the metal portion 36 located 0.12 mm from a corner portion of the array portion 34. A height of the metal portion 36 at the measurement point P1 is 25.1 μm. A measurement point P2 is a measurement result for the metal portion 36 located 0.21 mm from the corner portion of the array portion 34. A height of the metal portion 36 at the measurement point P2 is 24.9 μm. A measurement point P3 is a measurement result for the metal portion 36 located 0.35 mm from the corner portion of the array portion 34. A height of the metal portion 36 at the measurement point P3 is 22.8 μm. A measurement point P4 is a measurement result for the metal portion 36 located 1 mm from the corner portion of the array portion 34. A height of the metal portion 36 at the measurement point P4 is 21.8 μm. A measurement point P5 is a measurement result for the metal portion 36 located 4 mm from the corner portion of the array portion 34. A height of the metal portion 36 at the measurement point P5 is 20.7 μm.

In this way, a height of the metal portion 36 located on a corner portion side of the array portion 34 is larger than that of the metal portion 36 located on a central side of the array portion 34. For example, heights of the metal portions 36 at the measurement point P1 and the measurement point P2 are 10% or more larger than that of the metal portion 36 at the measurement point P5.

In FIG. 5, distribution of the heights of the multiple metal portions 36 is represented by color shading. In the metal portions 36 in FIG. 5, a darker color indicates a larger height of the metal portion 36. As shown in FIGS. 5 and 6, the heights of the metal portions 36 tend to be larger on an outer peripheral side of the array portion 34 than on the central side of the array portion 34. The heights of the metal portions 36 tend to be larger at the corner portion of the array portion 34 than other portions (for example, a portion on the central side with respect to sides).

The tendency is considered to be due to a fact that an electric field tends to concentrate on the corner portion of the array portion 34 when forming the metal portions 36 by electroplating as described above. Such variations in the heights of the multiple metal portions 36 may cause defects in the semiconductor device 30. In a manufacturing method other than electroplating, a film also cannot be formed under the same condition at a central portion and a corner portion of an array portion, which may cause variations in heights.

For example, when manufacturing is performed according to the metal portions 36 on the outer peripheral side having larger heights, the metal portions 36 on the central side having smaller heights may not have desired performance. On the other hand, when manufacturing is performed according to the metal portions 36 on the central side having smaller heights, the metal portions 36 on the outer peripheral side are too high, which may easily cause deformation or the like. For example, the metal portion 36 may be formed to have a height larger than a film thickness of the resist 24, and the metal portion 36 may get over the resist 24 and connect the adjacent metal portion 36.

Meanwhile, in the semiconductor device 10 according to the embodiment, the contour shape ES of the array portion 14 on the semiconductor substrate 12 is the polygonal shape having the interior angles larger than 90°. In the semiconductor device 10, the contour shape ES of the array portion 14 is the shape obtained by cutting corners of the quadrilateral contour shape ESr for reference. When the virtual quadrilateral VS is set for the contour shape ES of the array portion 14, the contour shape ES of the array portion 14 does not overlap the four vertices of the virtual quadrilateral VS.

Accordingly, in the semiconductor device 10, it is possible to prevent concentration of an electric field when forming the metal portions 16 (the first conductive portions 16*a*) by electroplating, and to prevent occurrence of variations in the heights of the metal portions 16. In the semiconductor device 10, for example, the variations in the heights of the metal portions 16 can be limited to 10% or less. In the semiconductor device 10, it is possible to prevent occurrence of defects caused by the variations in the heights of the multiple metal portions 16.

As shown in FIG. 6, a height of the metal portion 36 is larger at a position closer to the corner portion of the array portion 34 than the measurement point P3. At the position closer to the corner portion of the array portion 34 than the measurement point P3, the height of the metal portion 36 is 10% or more larger than that of the metal portion 36 on the central side of the array portion 34. A length of one side of the quadrilateral contour shape ESr of the semiconductor device 30 for reference is, for example, 17 mm. In this case, a length of a diagonal line of the contour shape ESr is about 23.8 mm. As described above, the measurement point P3 is the measurement result for the metal portion 36 located 0.35 mm from the corner portion of the array portion 34. A distance from the corner portion of the array portion 34 to the metal portion 36 at the measurement point P3 is a distance corresponding to about 1.5% of the length of the diagonal line of the contour shape ESr. Therefore, it can be considered that influence of the concentration of the electric field on the corner portion of the array portion 34 is small at a position spaced apart from the corner portion of the array portion 34 by 0.35 mm or more.

As shown in FIG. 6, a change in the height of the metal portion 36 between the measurement point P4 and the measurement point P5 is smaller than a change in the height of the metal portion 36 between the measurement point P3 and the measurement point P4. On the central side of the array portion 34 with respect to the measurement point P5, a change in the height of the metal portion 36 is smaller. As described above, the measurement point P5 is the measurement result for the metal portion 36 located 4 mm from the corner portion of the array portion 34. A distance from the corner portion of the array portion 34 to the metal portion 36 at the measurement point P5 is a distance corresponding to about 17% of the length of the diagonal line of the contour shape ESr. Therefore, it can be considered that the influence of the concentration of the electric field on the corner portion of the array portion 34 is sufficiently limited at a position spaced apart from the corner portion of the array portion 34 by 4 mm or more.

In the semiconductor device 10 according to the embodiment, the shortest distance D1 from the vertex VSc of the virtual quadrilateral VS to the array portion 14 is 1.5% or more of the length of the diagonal line of the virtual quadrilateral VS. In other words, the shortest distance D1 from the vertex VSc of the virtual quadrilateral VS to the array portion 14 is 0.35 mm or more. Accordingly, in the semiconductor device 10, it is possible to more appropriately suppress the concentration of the electric field when forming the metal portions 16 by electroplating, and to more appropriately prevent the occurrence of the variations in the heights of the metal portions 16. In the semiconductor device 10, for example, the variations in the heights of the metal portions 16 can be easily limited to 10% or less.

In the semiconductor device 10 according to the embodiment, the shortest distance D1 from the vertex VSc of the virtual quadrilateral VS to the array portion 14 is 17% or less of the length of the diagonal line of the virtual quadrilateral VS. In other words, the shortest distance D1 from the vertex VSc of the virtual quadrilateral VS to the array portion 14 is 4 mm or less. Accordingly, for example, it is possible to prevent a shape of the array portion 14 from becoming a shape in which corners are excessively cut. For example, it is possible to prevent an excessive decrease in an area of the array portion 14 and a decrease in the number of the multiple metal portions 16. For example, when the semiconductor device 10 is applied to a logic device or the like, it is possible to prevent a decrease in the number of signals that can be input to and output from the semiconductor device 10 due to a decrease in the number of the multiple metal portions 16. For example, it is possible to prevent a decrease in a ratio of the area of the array portion 14 to an area of the semiconductor substrate 12 and a deterioration in space efficiency. In this way, it is preferable that the shortest distance D1 from the vertex VSc of the virtual quadrilateral VS to the array portion 14 is, for example, 1.5% or more and 17% or less of the length of the diagonal line of the virtual quadrilateral VS.

In the semiconductor device 10 according to the embodiment, the longest distance D2 from the vertex VSc of the virtual quadrilateral VS to the array portion 14 is 17% or less of the length of the diagonal line of the virtual quadrilateral VS. In other words, the longest distance D2 from the vertex VSc of the virtual quadrilateral VS to the array portion 14 is 4 mm or less. Accordingly, for example, it is possible to further prevent the excessive decrease in the area of the array portion 14 and the decrease in the number of the multiple metal portions 16.

In this way, in the embodiment, it is possible to provide the semiconductor device 10 in which the variations in the heights of the multiple metal portions 16 are prevented and the method for manufacturing the same.

Figure 7:
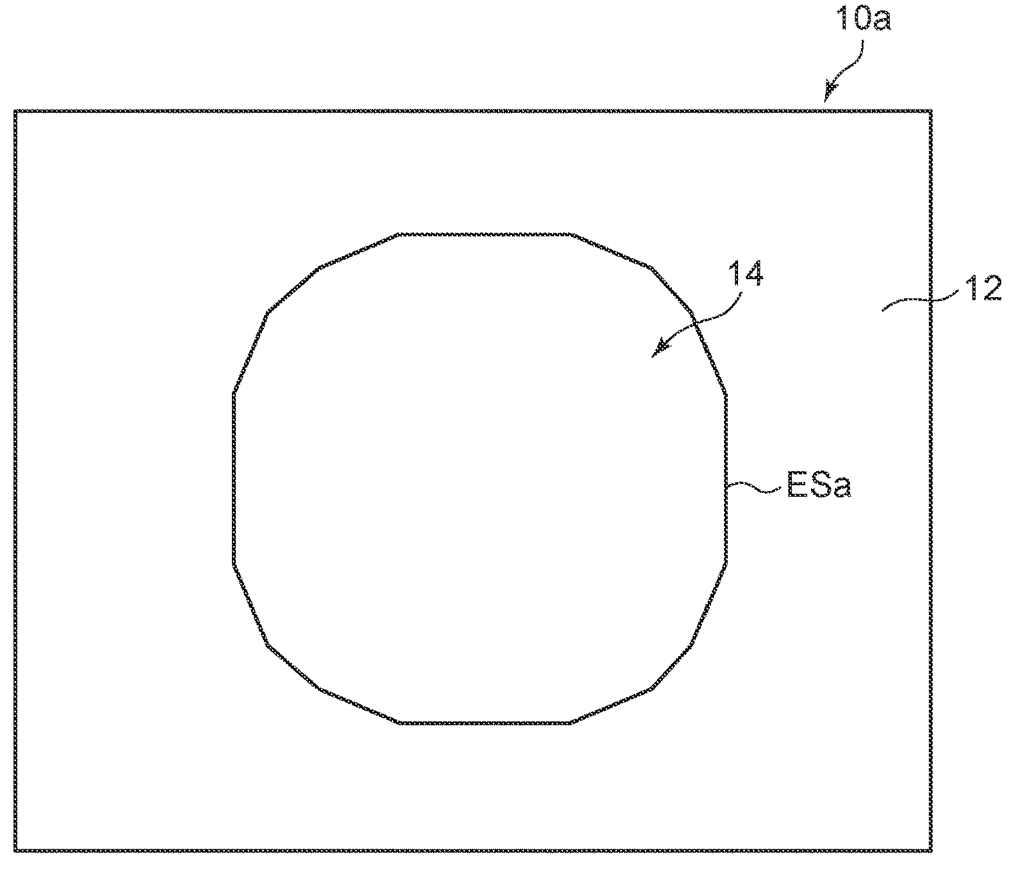
FIG. 7 is a plan view schematically showing a variation of the semiconductor device according to the first embodiment.

FIG. 7 is a plan view schematically showing a variation of the semiconductor device according to the first embodiment.

Components that are substantially the same in terms of function and configuration as those of the above embodiment are denoted by the same reference numerals, and detailed description thereof will be omitted.

As shown in FIG. 7, in a semiconductor device 10*a*, a contour shape ESa of the array portion 14 on the semiconductor substrate 12 is hexadecagon. The contour shape ESa is a shape obtained by further cutting corners of the octagonal contour shape ES according to the above embodiment. The contour shape ESa is a shape having interior angles larger than those of the octagonal contour shape ES according to the above embodiment.

Accordingly, in the semiconductor device 10*a*, for example, as compared with the semiconductor device 10, it is possible to further prevent the concentration of the electric field when forming the metal portions 16 by electroplating, and to further prevent the variations in the heights of the multiple metal portions 16. However, the contour shape of the array portion 14 is not limited to the above. The contour shape of the array portion 14 may be any polygonal shape having interior angles larger than 90°.

Figure 8:
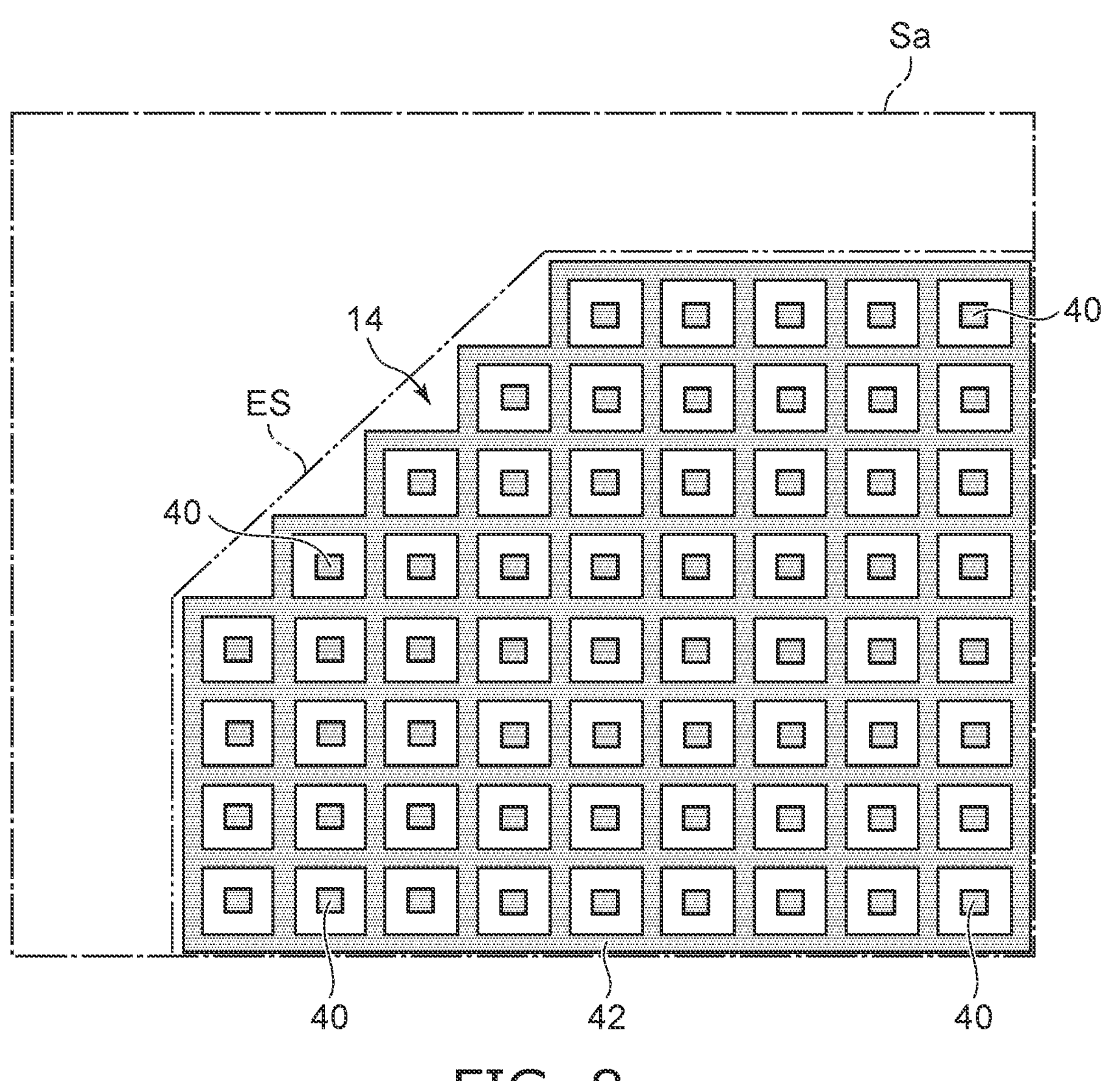
FIG. 8 is a plan view schematically showing a variation of the semiconductor device according to the first embodiment.

FIG. 8 is a plan view schematically showing a variation of the semiconductor device according to the first embodiment.

As shown in FIG. 8, in the example, the array portion 14 includes multiple metal portions 40 arranged on the semiconductor substrate 12, and further includes a metal portion 42. The metal portion 42 has a grid shape surrounding each of the multiple metal portions 40.

For example, when the semiconductor device 10 is applied to an RF-MEMS device, a high-performance logic device, or the like, the multiple metal portions 40 are used as electrodes for signal transmission and reception, and the metal portion 42 is used for setting a common potential (for example, a ground potential). Accordingly, for example, influence of electromagnetic interference on signals flowing through the multiple metal portions 40 can be limited. For example, the semiconductor device 10 having high resistance to electromagnetic interference can be provided. For example, when the semiconductor device 10 is applied to an electron beam control device such as an electron lens or a deflector that changes a traveling direction of an electron beam, the multiple metal portions 40 are used as electrodes that set potentials for changing the traveling direction of the electron beam, and the metal portion 42 is used as an electrode that sets a common potential. Accordingly, for example, the common potential of the metal portion 42 can be easily set as compared with a case where set the common potential of the multiple metal portions while setting deflection potential of each of the metal portions 40.

In the example, for example, the contour shape ES of the array portion 14 on the semiconductor substrate 12 is defined by a contour of the metal portion 42. The contour shape ES is obtained, for example, by linear approximation (polygonal approximation) of line segments connecting outer edges of the metal portion 42 located at an outermost periphery among the multiple metal portions 40 and the metal portion 42 as viewed from a direction orthogonal to a surface of the semiconductor substrate 12 or in a layout pattern on the surface of the semiconductor substrate 12. In this way, the contour shape ES of the array portion 14 is not limited to a configuration defined by the multiple metal portions 16, and may be defined by the metal portion 42 among the multiple metal portions 40 and the metal portion 42.

Figure 9:
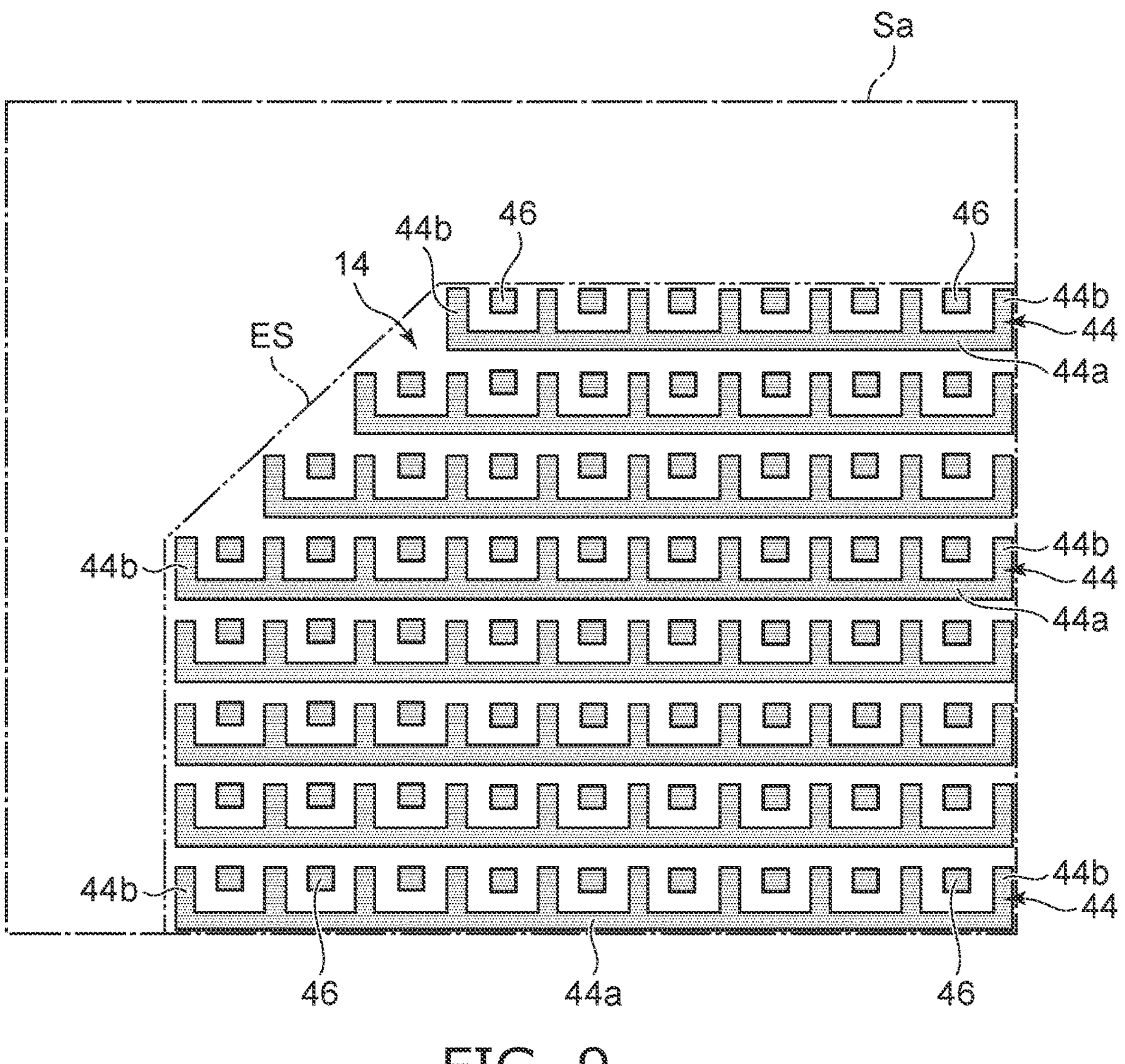
FIG. 9 is a plan view schematically showing a variation of the semiconductor device according to the first embodiment.

FIG. 9 is a plan view schematically showing a variation of the semiconductor device according to the first embodiment.

As shown in FIG. 9, in the example, the array portion 14 includes multiple metal portions 44 and multiple metal portions 46 arranged on the semiconductor substrate 12.

The multiple metal portions 44 extend in a first direction parallel to a surface of the semiconductor substrate 12 and are arranged in a second direction that is parallel to the surface of the semiconductor substrate 12 and that is orthogonal to the first direction. The first direction is, for example, a left-right direction of a paper surface of FIG. 9, and the second direction is, for example, an upper-lower direction of the paper surface of FIG. 9.

Each of the multiple metal portions 44 includes a first portion 44*a* extending in the first direction and multiple second portions 44*b* extending in the second direction from the first portion 44*a* and arranged in the first direction. The multiple second portions 44*b* are spaced apart from the first portion 44*a* of the adjacent metal portion 44. The multiple metal portions 44 are arranged in the second direction at predetermined intervals.

The multiple metal portions 46 are arranged in the first direction and the second direction in a manner of being disposed between the multiple second portions 44*b* of the multiple metal portions 44.

In other words, a pattern of the multiple metal portions 44 and 46 is a pattern in which gaps are provided in parts of the metal portion 42 shown in FIG. 8. In this way, a metal pattern of the array portion 14 may be a pattern surrounding peripheries of the metal portions 46 with the gaps provided in parts thereof, instead of surrounding the entire peripheries of the metal portions 46. For example, when the semiconductor device 10 is applied to an electron beam control device such as an electron lens or a deflector that changes a traveling direction of an electron beam, the multiple metal portions 46 are used as electrodes that set potentials for changing the traveling direction of the electron beam, and the multiple metal portions 44 are used as electrodes that set a common potential. Accordingly, for example, the metal portions 44 can easily set the common potential while the metal portions 46 can set deflection potentials.

Figure 10:
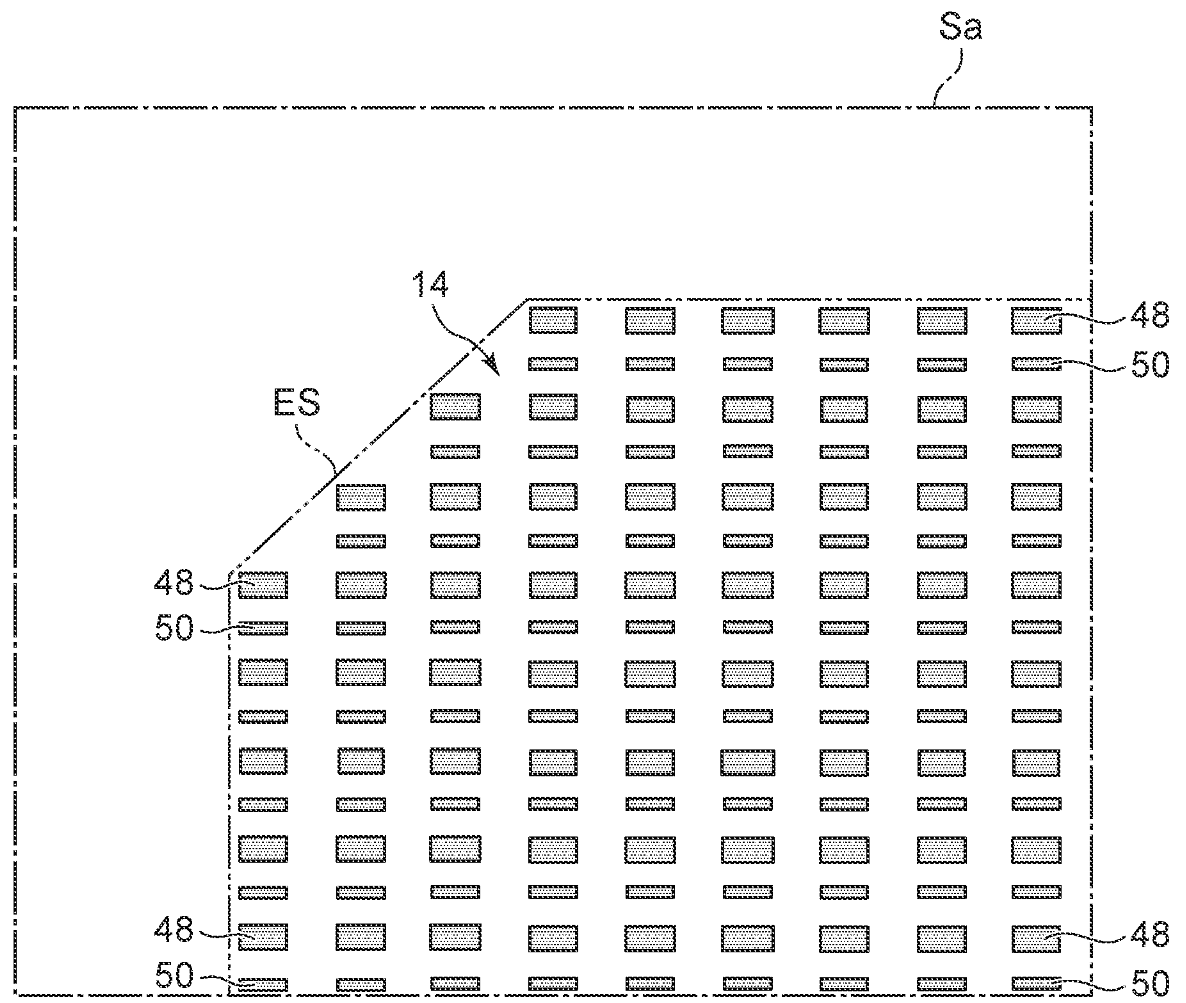
FIG. 10 is a plan view schematically showing a variation of the semiconductor device according to the first embodiment.

FIG. 10 is a plan view schematically showing a variation of the semiconductor device according to the first embodiment.

As shown in FIG. 10, in the example, the array portion 14 includes multiple metal portions 48 and multiple metal portions 50 arranged on the semiconductor substrate 12.

The multiple metal portions 48 are arranged in lines in a first direction parallel to a surface of the semiconductor substrate 12, and are arranged in a second direction parallel to the surface of the semiconductor substrate 12 and orthogonal to the first direction.

The multiple metal portions 50 are arranged in lines in the first direction, and are arranged in the second direction in a manner of being disposed between lines of the multiple metal portions 48.

A shape of each of the multiple metal portions 48 is different from a shape of each of the multiple metal portions 50. For example, a length of each of the multiple metal portions 48 in the second direction is larger than that of each of the multiple metal portions 50 in the second direction. In this way, a metal pattern of the array portion 14 may be a pattern formed by multiple types of metal portions 48 and 50 having different shapes. In other words, the multiple metal portions may include multiple types of metal portions having different shapes. For example, when the semiconductor device 10 is applied to an electron beam control device such as an electron lens or a deflector that changes a traveling direction of an electron beam, the multiple metal portions 50 are used as electrodes that set potentials for changing the traveling direction of the electron beam, and the multiple metal portions 48 are used as electrodes that set a common potential.

Figure 11:
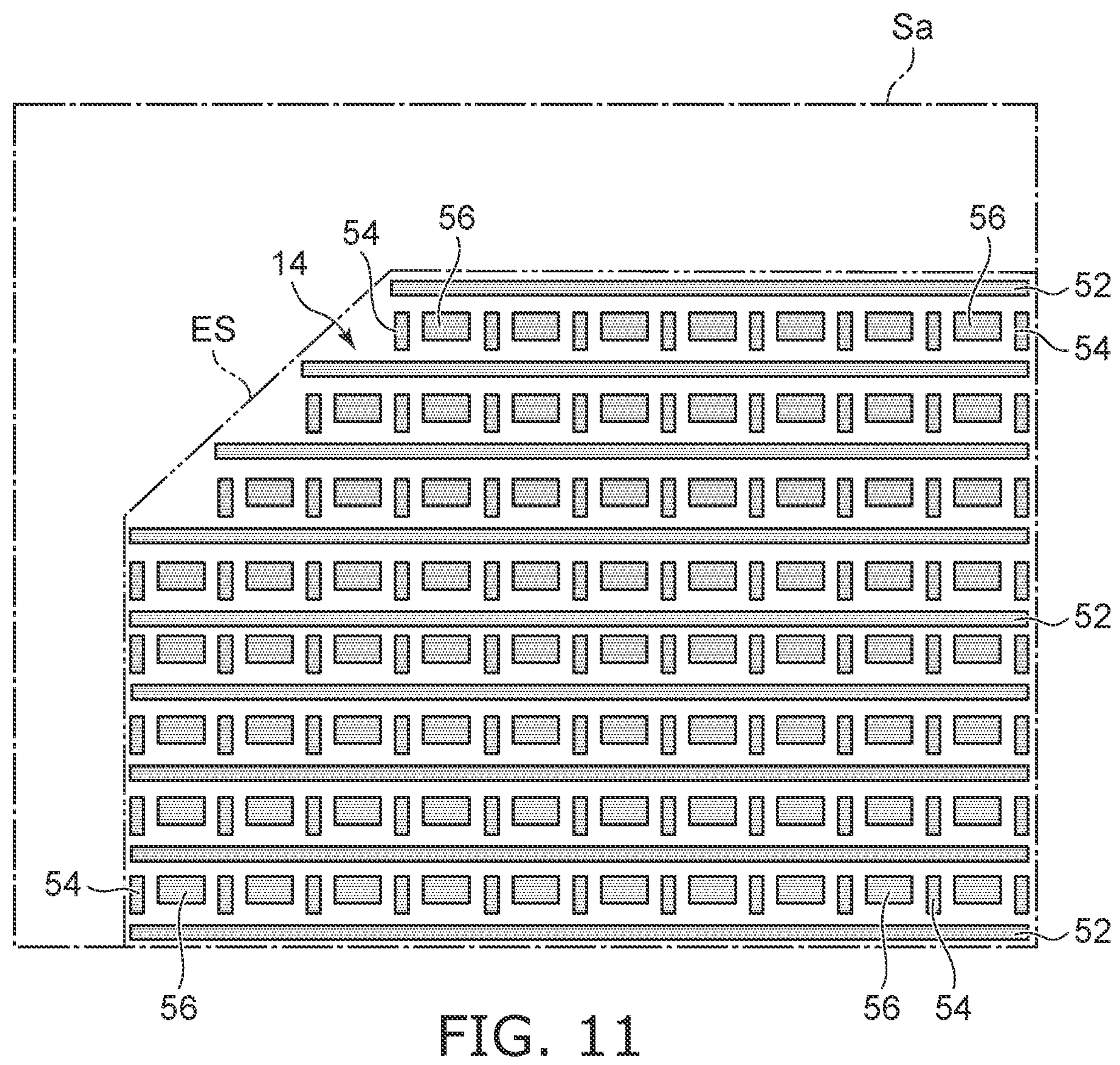
FIG. 11 is a plan view schematically showing a variation of the semiconductor device according to the first embodiment.

FIG. 11 is a plan view schematically showing a variation of the semiconductor device according to the first embodiment.

As shown in FIG. 11, in the example, the array portion 14 includes multiple metal portions 52, multiple metal portions 54, and multiple metal portions 56 arranged on the semiconductor substrate 12.

The multiple metal portions 52 extend in a first direction parallel to a surface of the semiconductor substrate 12 and are arranged in a second direction parallel to the surface of the semiconductor substrate 12 and orthogonal to the first direction.

The multiple metal portions 54 are arranged in the first direction and the second direction in a manner of being disposed between the multiple metal portions 52.

The multiple metal portions 56 are arranged in the first direction and the second direction in a manner of being disposed between the multiple metal portions 52 and between the multiple metal portions 54. For example, the multiple metal portions 54 and the multiple metal portions 56 are alternately arranged in the first direction. A shape of each of the multiple metal portions 56 is different from a shape of each of the multiple metal portions 54. For example, a length of each of the multiple metal portions 56 in the first direction is larger than that of each of the multiple metal portions 54 in the first direction.

In other words, a pattern of the multiple metal portions 52, 54, and 56 is a pattern in which gaps are provided between the first portion 44*a* and the multiple second portions 44*b* of each of the multiple metal portions 44 shown in FIG. 9. In this way, a metal pattern of the array portion 14 may be a pattern formed by three or more types of metal portions 52, 54, and 56 having different shapes. In other words, the multiple metal portions may include three or more types of metal portions having different shapes. For example, when the semiconductor device 10 is applied to an electron beam control device such as an electron lens or a deflector that changes a traveling direction of an electron beam, the multiple metal portions 56 are used as electrodes that set potentials for changing the traveling direction of the electron beam, and the multiple metal portions 52 and the multiple metal portions 54 are used as electrodes that set a common potential.

Figure 12:
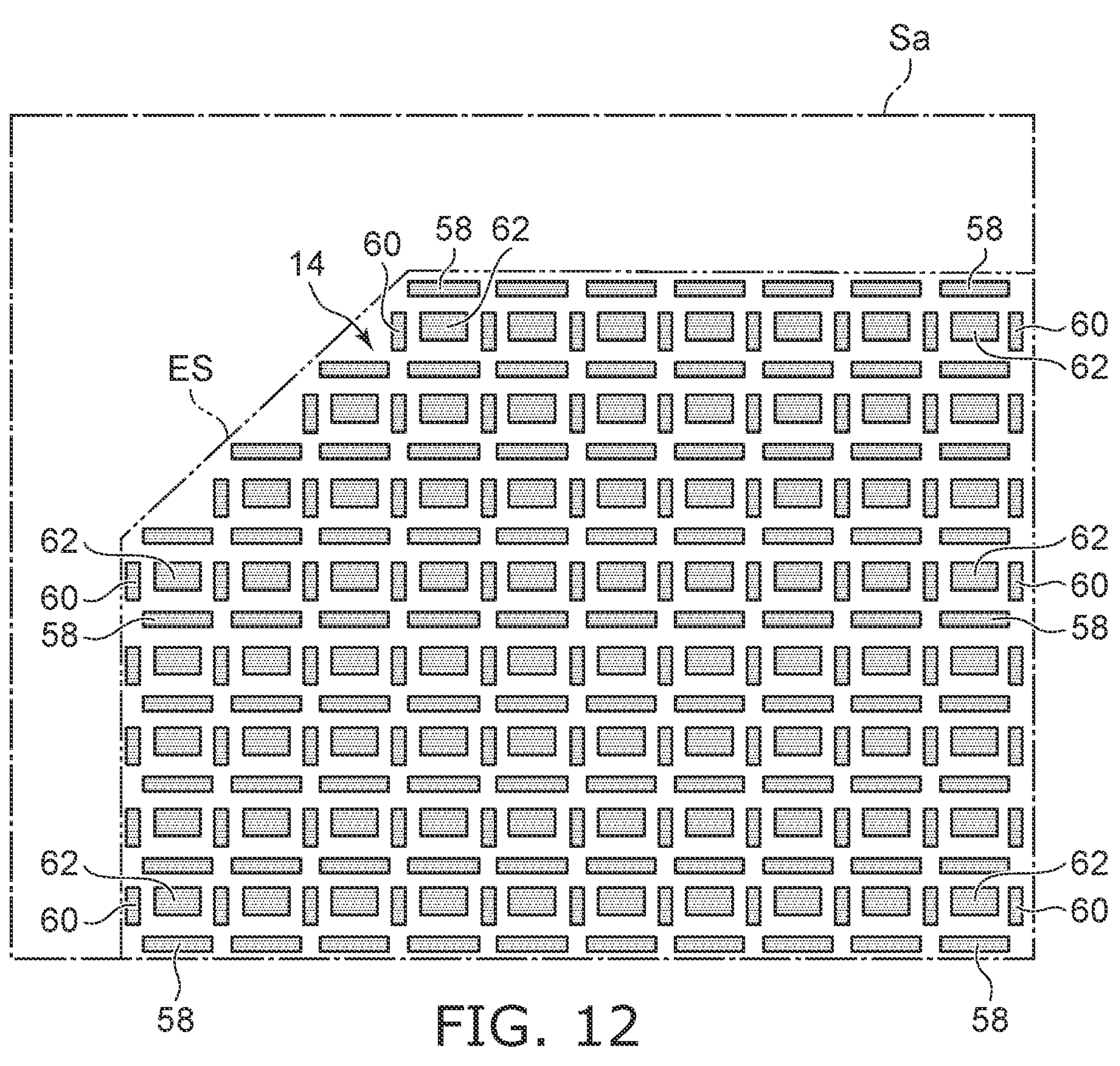
FIG. 12 is a plan view schematically showing a variation of the semiconductor device according to the first embodiment.

FIG. 12 is a plan view schematically showing a variation of the semiconductor device according to the first embodiment.

As shown in FIG. 12, in the example, the array portion 14 includes multiple metal portions 58, multiple metal portions 60, and multiple metal portions 62 arranged on the semiconductor substrate 12.

The multiple metal portions 58 are arranged in a first direction parallel to a surface of the semiconductor substrate 12 and a second direction parallel to the surface of the semiconductor substrate 12 and orthogonal to the first direction.

The multiple metal portions 60 are arranged in the first direction and the second direction in a manner of being disposed between the multiple metal portions 58.

The multiple metal portions 62 are arranged in the first direction and the second direction in a manner of being disposed between the multiple metal portions 58 and between the multiple metal portions 60. For example, the multiple metal portions 60 and the multiple metal portions 62 are alternately arranged in the first direction. A shape of each of the multiple metal portions 62 is different from a shape of each of the multiple metal portions 60. For example, a length of each of the multiple metal portions 62 in the first direction is larger than that of each of the multiple metal portions 60 in the first direction.

In other words, a pattern of the multiple metal portions 58, 60, and 62 is a pattern in which multiple gaps are provided between the multiple metal portions 52 shown in FIG. 11. In other words, a metal pattern of the array portion 14 in the example is a pattern surrounding a periphery of each of the metal portions 62 by four metal portions, namely two metal portions 58 and two metal portions 60. For example, when the semiconductor device 10 is applied to an electron beam control device such as an electron lens or a deflector that changes a traveling direction of an electron beam, the multiple metal portions 62 are used as electrodes that set potentials for changing the traveling direction of the electron beam, and the multiple metal portions 58 and the multiple metal portions 60 are used as electrodes that set a common potential.

The metal pattern of the array portion 14 is not limited to the above, and may be any pattern formed by arranging the multiple metal portions. For example, in a case of a pattern in which a metal portion is surrounded by another metal portion as shown in FIG. 8 and the like, two or more metal portions may be surrounded by a grid-shaped metal portion.

Second Embodiment

Figure 13:
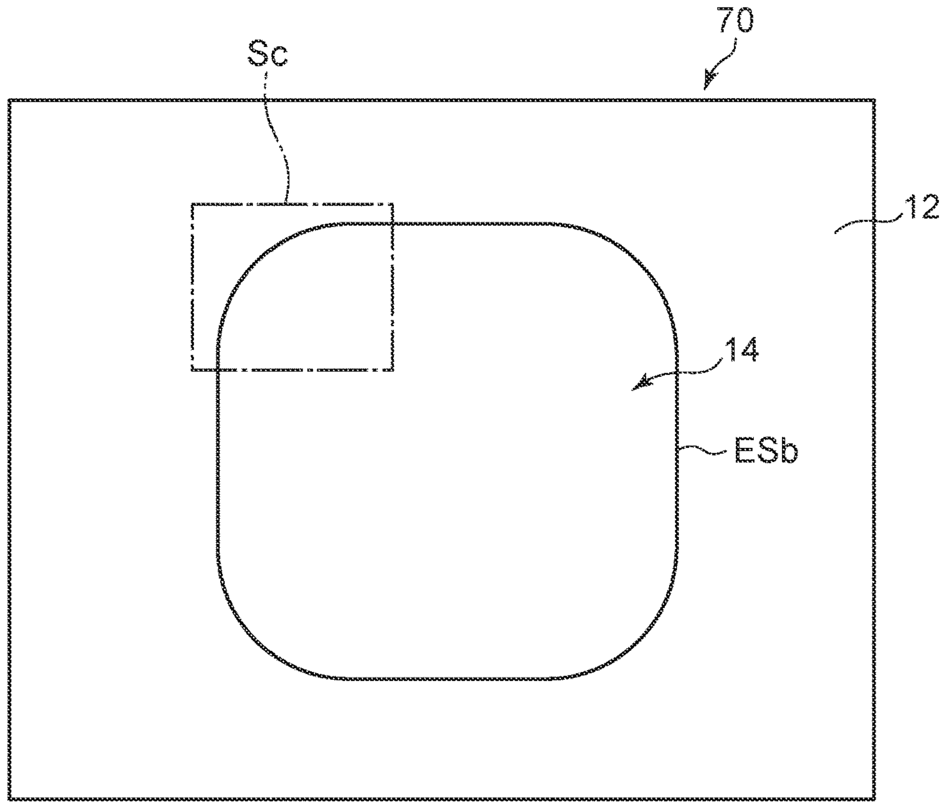
FIG. 13 is a plan view schematically showing a semiconductor device according to a second embodiment.

FIG. 13 is a plan view schematically showing a semiconductor device according to a second embodiment.

Figure 14:
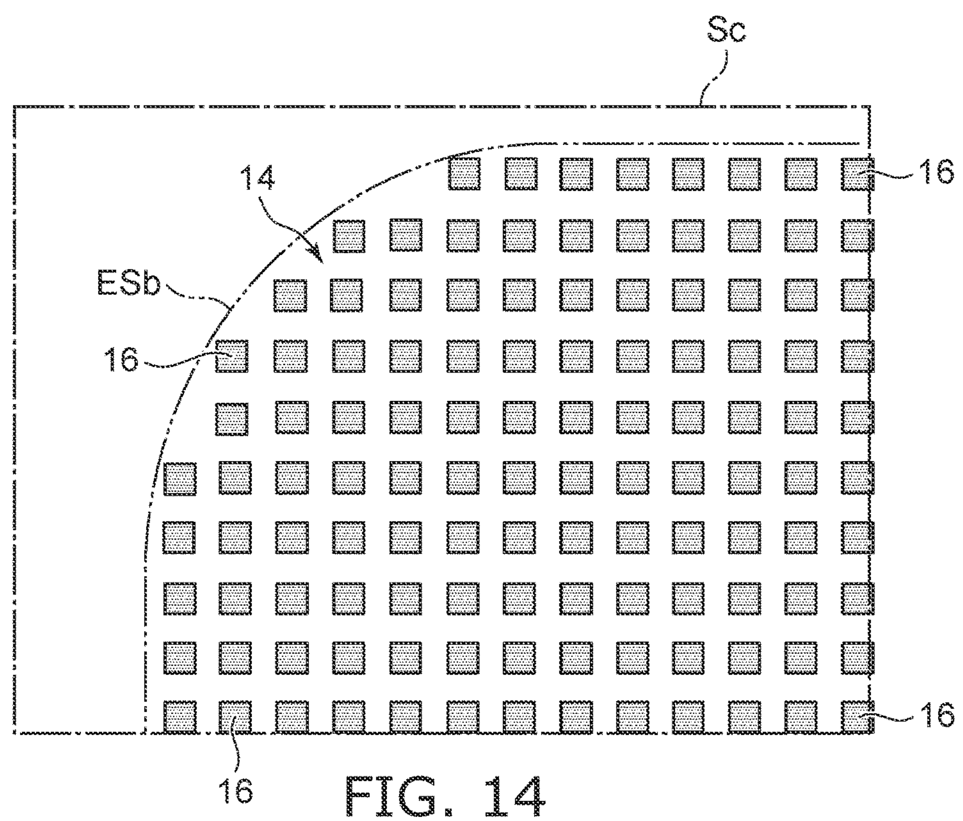
FIG. 14 is an enlarged plan view schematically showing a part of the semiconductor device according to the second embodiment.

FIG. 14 is an enlarged plan view schematically showing a part of the semiconductor device according to the second embodiment.

FIG. 14 is the enlarged view of an enclosed portion Sc in FIG. 13.

As shown in FIGS. 13 and 14, a semiconductor device 70 includes the semiconductor substrate 12 and the array portion 14 similarly to the first embodiment. The array portion 14 includes the multiple metal portions 16 arranged on the semiconductor substrate 12.

In the semiconductor device 70, a contour shape ESb of the array portion 14 on the semiconductor substrate 12 is a polygonal shape with rounded corners. In the example, the contour shape ESb of the array portion 14 is a quadrilateral shape with rounded corners. In other words, the contour shape ESb of the array portion 14 is a shape obtained by cutting corners of the quadrilateral contour shape ESr for reference into curved shapes.

In this way, the contour shape ESb of the array portion 14 is not limited to a polygonal shape having interior angles larger than 90°, and may be a polygonal shape with rounded corners. In other words, the contour shape ESb of the array portion 14 is not limited to a shape obtained by linearly cutting the corners of the quadrilateral contour shape ESr for reference, and may be a shape obtained by cutting the corners of the quadrilateral contour shape ESr for reference into curved shapes. In this case, similarly to the first embodiment, it is also possible to prevent concentration of an electric field when forming the metal portions 16 (the first conductive portions 16*a*) by electroplating, and to prevent occurrence of variations in heights of the metal portions 16.

The contour shape ESb that is a polygonal shape with rounded corners is not limited to a quadrilateral shape, and may be an octagonal shape, a hexadecagonal shape, or the like with rounded corners. The contour shape ESb may be any polygonal shape with rounded corners.

The contour shape ESb that is the polygonal shape with rounded corners can be obtained, for example, by linear approximation (polygonal approximation) and curve approximation of line segments connecting outer edges of metal portions 16 located at an outermost periphery among the multiple metal portions 16 as viewed from a direction orthogonal to a surface of the semiconductor substrate 12 or in a layout pattern on the surface of the semiconductor substrate 12. In other words, the contour shape ESb is a shape in which a side portion is defined by linear approximation of a line segment connecting outer edges of metal portions 16 located at the outermost periphery, and a curved portion connecting both ends of two adjacent sides is defined by curve approximation of a line segment connecting outer edges of metal portions 16 located at the outermost periphery.

In the array portion 14 having the contour shape ESb that is the polygonal shape with rounded corners, a metal pattern of the array portion 14 may also be any pattern formed by arranging the multiple metal portions as described with reference to FIGS. 8 to 12.

Figure 15:
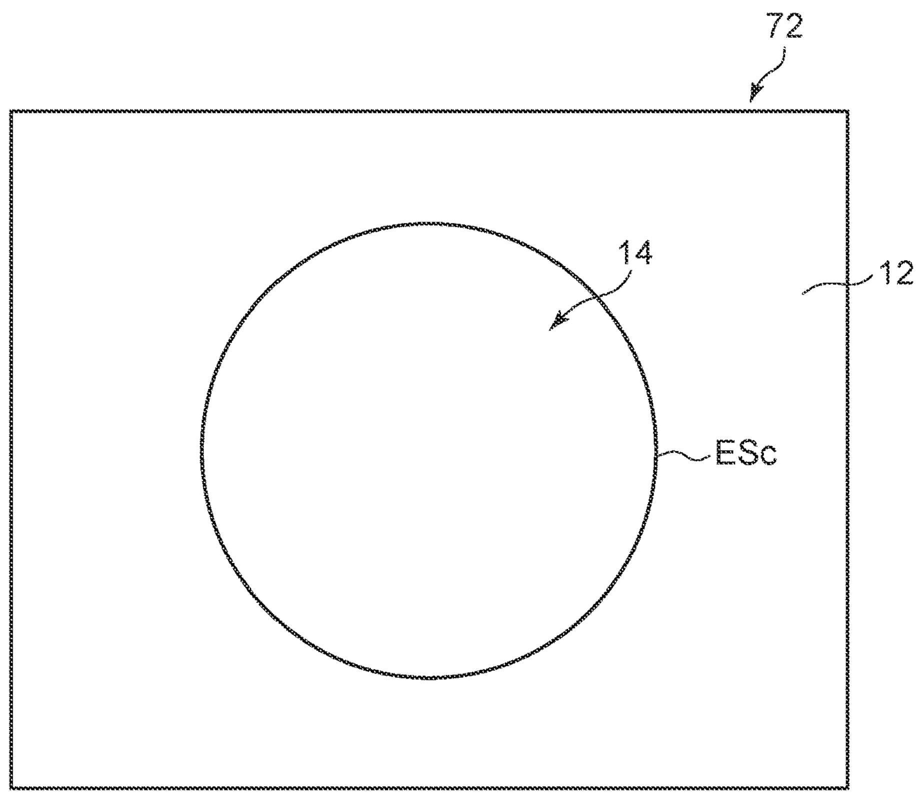
FIG. 15 is a plan view schematically showing variation of the semiconductor device according to the second embodiment.
Figure 16:
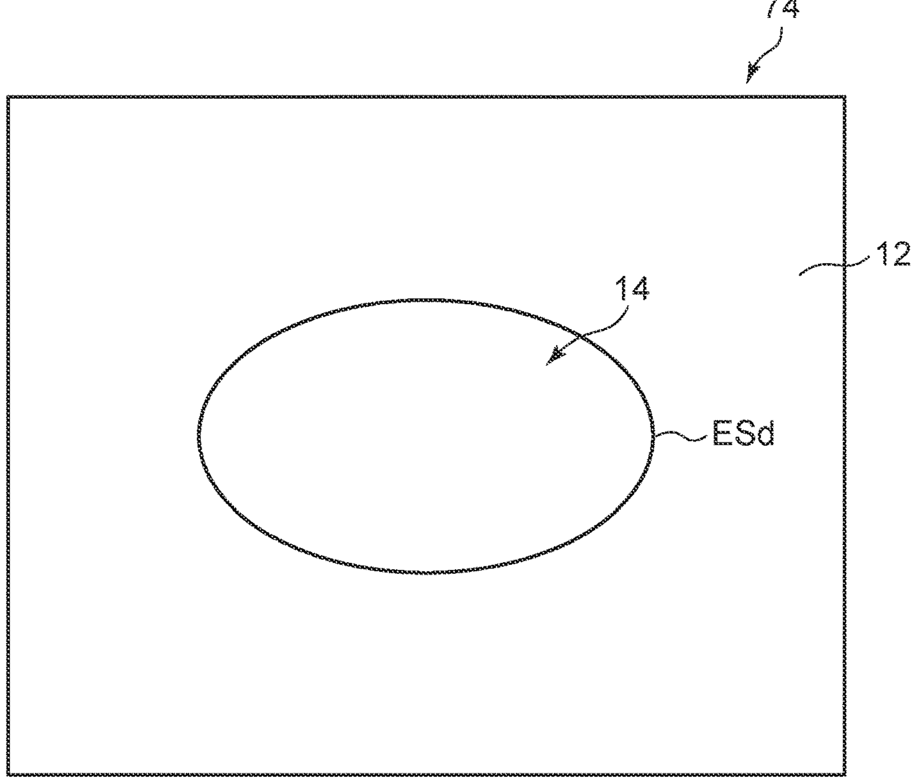
FIG. 16 is a plan view schematically showing variation of the semiconductor device according to the second embodiment.

FIGS. 15 and 16 are plan views schematically showing variations of the semiconductor device according to the second embodiment.

As shown in FIG. 15, in a semiconductor device 72, a contour shape ESc of the array portion 14 on the semiconductor substrate 12 is circular.

As shown in FIG. 16, in a semiconductor device 74, a contour shape ESd of the array portion 14 on the semiconductor substrate 12 is elliptical.

The circular contour shape ESc and the elliptical contour shape ESd can be obtained, for example, by curve approximation of line segments connecting outer edges of metal portions 16 located at an outermost periphery among the multiple metal portions 16 as viewed from a direction orthogonal to a surface of the semiconductor substrate 12 or in a layout pattern on the surface of the semiconductor substrate 12. In other words, the contour shapes ESc and ESd are shapes defined by curve approximation of the line segments connecting the outer edges of the predetermined number of metal portions 16 located at the outermost periphery.

In the array portion 14 of the circular contour shape ESc and the elliptical contour shape ESd, a metal pattern of the array portion 14 may also be any pattern formed by arranging the multiple metal portions as described with reference to FIGS. 8 to 12.

In this way, the contour shape of the array portion 14 may be circular, elliptical, or the like. In this way, when the contour shape of the array portion 14 is a circular shape or an elliptical shape having no corners, it is possible to more appropriately suppress concentration of an electric field when forming the metal portions 16 (the first conductive portions 16*a*) by electroplating, and to more appropriately prevent occurrence of variations in heights of the metal portions 16.

On the contrary, when the contour shape of the array portion 14 is circular or elliptical, an area of the array portion 14 may excessively decrease and the number of the multiple metal portions 16 may decrease as described above.

Therefore, it is preferable that the contour shape of the array portion 14 is a polygonal shape having interior angles larger than 90° or a polygonal shape with rounded corners, and the shortest distance D1 from the vertex VSc of the virtual quadrilateral VS to the array portion 14 is 1.5% or more and 17% or less of a length of a diagonal line of the virtual quadrilateral VS. The longest distance D2 from the vertex VSc of the virtual quadrilateral VS to the array portion 14 is more preferably 17% or less of the length of the diagonal line of the virtual quadrilateral VS. Accordingly, it is possible to prevent a decrease in the number of the multiple metal portions 16 while preventing the variations in the heights of the metal portions 16.

The contour shape of the array portion 14 is not limited to the above, and may be any shape that does not overlap four vertices of the virtual quadrilateral VS when the virtual quadrilateral VS having a minimum area and circumscribing the contour shape of the array portion 14 is set.

In the specification of the application, "electrically connected" includes not only direct contact connection but also connection via another conductive member or the like.

Embodiments may include the following configurations.

Appendix 1

A semiconductor device comprising:

a semiconductor substrate; and an array portion including a plurality of metal portions arranged on the semiconductor substrate, when a virtual quadrilateral circumscribing minimally a contour shape of the array portion on the semiconductor substrate is set, the contour shape of the array portion not overlapping each of four vertices of the virtual quadrilateral.

Appendix 2

The device according to Appendix 1, wherein the contour shape of the array portion is a polygonal shape having interior angles larger than 90°.

Appendix 3

The device according to Appendix 1, wherein the contour shape of the array portion is a polygonal shape with rounded corners.

Appendix 4

The device according to Appendix 1, wherein the contour shape of the array portion is circular.

Appendix 5

The device according to Appendix 1, wherein the contour shape of the array portion is elliptical.

Appendix 6

The device according to any one of Appendixes 1 to 5, wherein a shortest distance from a vertex of the virtual quadrilateral to the array portion is 1.5% or more of a length of a diagonal line of the virtual quadrilateral.

Appendix 7

The device according to any one of Appendixes 1 to 6, wherein a shortest distance from a vertex of the virtual quadrilateral to the array portion is 17% or less of a length of a diagonal line of the virtual quadrilateral.

Appendix 8

The device according to any one of Appendixes 1 to 7, wherein a longest distance from a vertex of the virtual quadrilateral to the array portion is 17% or less of a length of a diagonal line of the virtual quadrilateral.

Appendix 9

The device according to any one of Appendixes 1 to 8, wherein each of the plurality of metal portions has a height of 5 μm or more and 40 μm or less.

Appendix 10

The device according to any one of Appendixes 1 to 9, wherein each of the plurality of metal portions includes a first conductive portion and a second conductive portion provided between the semiconductor substrate and the first conductive portion.

Appendix 11

The device according to Appendix 10, wherein a length of the first conductive portion in a height direction is larger than that of the second conductive portion in the height direction.

Appendix 12

The device according to any one of Appendixes 10 and 11, wherein the first conductive portion contains at least one of tin, silver, copper, aluminum, nickel, and gold.

Appendix 13

The device according to any one of Appendixes 10 to 12, wherein the second conductive portion contains at least one of tin, silver, copper, aluminum, nickel, platinum, titanium, palladium, and gold.

Appendix 14

The device according to any one of Appendixes 1 to 13, further comprising:

an insulating layer provided on the semiconductor substrate, the plurality of metal portions being provided on the insulating layer.

Appendix 15

The device according to any one of Appendixes 1 to 14, wherein the plurality of metal portions are arranged in a first direction parallel to a surface of the semiconductor substrate and a second direction that is parallel to the surface of the semiconductor substrate and that is orthogonal to the first direction.

Appendix 16

The device according to any one of Appendixes 1 to 15, wherein the plurality of metal portions include a plurality of types of metal portions having different shapes.

Appendix 17

A method for manufacturing a semiconductor device including a semiconductor substrate, and an array portion including a plurality of metal portions arranged on the semiconductor substrate, when a virtual quadrilateral circumscribing minimally a contour shape of the array portion on the semiconductor substrate is set, the contour shape of the array portion not overlapping four vertices of the virtual quadrilateral, the method comprising:

applying a resist on a semiconductor substrate;

forming a pattern having a shape corresponding to the plurality of metal portions in the resist;

forming a plurality of first conductive portions on the semiconductor substrate by forming a metal layer in openings of the patterned resist; and forming the plurality of metal portions by the plurality of first conductive portions by removing the resist.

Appendix 18

The method according to Appendix 17, wherein the providing the resist on the semiconductor substrate includes forming an electrode metal layer on the semiconductor substrate and providing the resist on the electrode metal layer, the forming the plurality of first conductive portions includes forming the plurality of first conductive portions by electroplating using the electrode metal layer as an electrode, and the forming the plurality of metal portions includes forming the plurality of metal portions by the plurality of first conductive portions and the plurality of second conductive portions by patterning the electrode metal layer using the plurality of first conductive portions as a mask after removing the resist and forming the plurality of second conductive portions between the plurality of first conductive portions and the semiconductor substrate.

Hereinabove, embodiments of the invention are described with reference to specific examples. However, the embodiments of the invention are not limited to these specific examples. For example, the specific configurations of the components included in the semiconductor device are incorporated in the scope of the invention as long as a person skilled in the art appropriately selects components from the publicly known range to similarly implement the invention for obtaining the similar effect.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:

a semiconductor substrate; and an array portion including a plurality of metal portions arranged on the semiconductor substrate, wherein when a virtual quadrilateral minimally circumscribing a contour shape of the array portion on the semiconductor substrate is set, the contour shape of the array portion does not overlap any of four vertices of the virtual quadrilateral, a shortest distance from a vertex of the virtual quadrilateral to the array portion is 1.5% or more of a length of a diagonal line of the virtual quadrilateral, each of the plurality of metal portions has a height of 5 μm or more and 40 μm or less, and a first height of a first metal portion is between 1.0 and 1.1 times a second height of a second metal portion, the first metal portion being a tallest metal portion among the plurality of metal portions, the second metal portion being a shortest metal portion among the plurality of metal portions.

2. The device according to claim 1, wherein the contour shape of the array portion is a polygonal shape having interior angles larger than 90°.

3. The device according to claim 1, wherein the contour shape of the array portion is a polygonal shape with rounded corners.

4. The device according to claim 1, wherein the contour shape of the array portion is circular.

5. The device according to claim 1, wherein the contour shape of the array portion is elliptical.

6. The device according to claim 1, wherein a shortest distance from a vertex of the virtual quadrilateral to the array portion is 17% or less of a length of a diagonal line of the virtual quadrilateral.

7. The device according to claim 1, wherein a longest distance from a vertex of the virtual quadrilateral to the array portion is 17% or less of a length of a diagonal line of the virtual quadrilateral.

8. The device according to claim 1, wherein each of the plurality of metal portions includes a first conductive portion and a second conductive portion provided between the semiconductor substrate and the first conductive portion.

9. The device according to claim 8, wherein a length of the first conductive portion in a height direction is larger than that of the second conductive portion in the height direction.

10. The device according to claim 8, wherein the first conductive portion contains at least one of tin, silver, copper, aluminum, nickel, and gold.

11. The device according to claim 8, wherein the second conductive portion contains at least one of tin, silver, copper, aluminum, nickel, platinum, titanium, palladium, and gold.

12. The device according to claim 1, further comprising:

an insulating layer provided on the semiconductor substrate, the plurality of metal portions being provided on the insulating layer.

13. The device according to claim 1, wherein the plurality of metal portions are arranged in a first direction parallel to a semiconductor substrate surface and a second direction that is parallel to the semiconductor substrate surface and that is orthogonal to the first direction.

14. The device according to claim 1, wherein the plurality of metal portions include a plurality of types of metal portions having different shapes.

* * * * *